(12) United States Patent
Ayyapureddi

(10) Patent No.: US 11,841,766 B2
(45) Date of Patent: Dec. 12, 2023

(54) MEMORY ARRAY ERROR CORRECTION

(71) Applicant: Micron Technology, Inc., Boise, ID (US)

(72) Inventor: Sujeet V. Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 21 days.

(21) Appl. No.: 17/548,057

(22) Filed: Dec. 10, 2021

(65) Prior Publication Data

US 2023/0185662 A1 Jun. 15, 2023

(51) Int. Cl.
| | |
|---|---|
| *G06F 11/10* | (2006.01) |
| *G06F 11/07* | (2006.01) |
| *G11C 29/12* | (2006.01) |
| *G11C 29/08* | (2006.01) |
| *G11C 29/18* | (2006.01) |

(52) U.S. Cl.
CPC ........ *G06F 11/1068* (2013.01); *G06F 11/076* (2013.01); *G06F 11/0772* (2013.01); *G11C 29/1201* (2013.01); *G11C 29/12005* (2013.01); *G11C 29/18* (2013.01)

(58) Field of Classification Search
CPC ............... G11C 29/18; G11C 29/1201; G11C 29/12005; G06F 11/0772; G06F 11/076; G06F 11/1068
See application file for complete search history.

(56) References Cited

U.S. PATENT DOCUMENTS

| | | | |
|---|---|---|---|
| 11,221,913 B2* | 1/2022 | Rooney | G11C 11/406 |
| 2011/0161784 A1* | 6/2011 | Selinger | G06F 11/1016 |
| | | | 714/E11.002 |
| 2019/0051359 A1* | 2/2019 | Yoo | G11C 16/10 |

* cited by examiner

*Primary Examiner* — Guy J Lamarre
(74) *Attorney, Agent, or Firm* — Holland & Hart LLP

(57) ABSTRACT

Methods, systems, and devices for memory operations are described. A codeword may be associated with a set of data and stored in a memory device may be detected as having a plurality of bit errors. Based on detecting the plurality of bit errors in the codeword, an address of the codeword may be stored and an indication that at least one codeword stored in the memory device has a plurality of bit errors may be indicated. Based on indicating that at least one codeword in the memory device has a plurality of bit errors, a write command for writing, to the memory device, a second codeword associated with the set of data may be received. Additionally, or alternatively, a command that triggers an error correction operation at an address range of the memory device may be received at a memory device.

20 Claims, 8 Drawing Sheets

MEMORY ARRAY ERROR CORRECTION

FIELD OF TECHNOLOGY

The following relates generally to one or more systems for memory and more specifically to memory array error correction.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
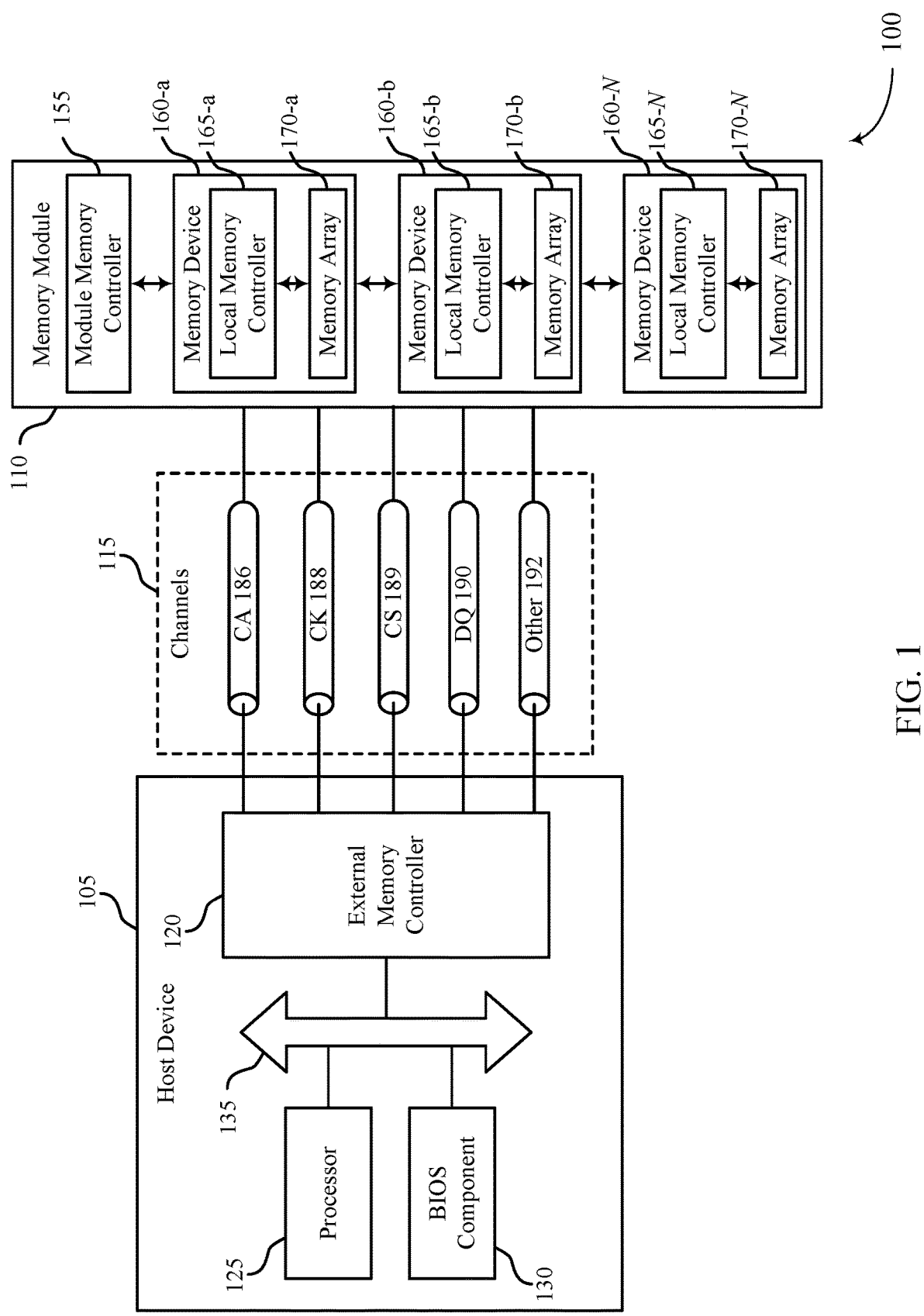
FIG. 1 illustrates an example of a system that supports memory array error correction in accordance with examples as disclosed herein.

Data protection techniques may be used to protect against errors by detecting and, in some examples, correcting errors in data stored at a memory device. In some examples, data protection techniques correct errors in data output from a memory device but do not actually correct the errors in the memory device. To correct errors in a memory device, a memory device may perform (e.g., using equipped data protection circuitry) a die-level scrubbing operation to correct errors at a set of addresses detected by the memory device. Additionally, or alternatively, to correct errors in a memory device, a system-level device (e.g., a host device or module memory controller) may perform (e.g., using equipped data protection circuitry) a system-level scrubbing operation. The system-level data protection circuitry may have enhanced capabilities relative to the die-level data protection circuitry—e.g., may be able to protect against a higher quantity of errors than the die-level data protection circuitry.

As described herein, a memory device (e.g., a memory die) that uses an on-die data protection component to correct errors in an accessed codeword during a read operation may not correct the corresponding codeword stored in the memory device. Also, on-die scrubbing operations performed by a memory device may be separated by significant durations (e.g., 24-hour durations). Additionally, an on-die data protection component may be unable to correct more than one error in a codeword—e.g., if a SECDED data protection component is used. Accordingly, errors in codewords stored at a memory device that are correctable (e.g., codewords with single-bit errors) may become uncorrectable by the on-die data protection component (e.g., codewords with multi-bit errors) if additional errors are introduced between on-die scrubbing operations (e.g., due to neutron strikes, defects, short-circuits, disturbances, radiation, etc.). Moreover, during an on-die scrubbing operation, the on-die data protection component may introduce additional errors into codewords with multiple errors while attempting to correct these codewords—e.g., as a result of aliasing. The increase of errors in a codeword over time may be referred to as an accumulation of errors.

As described herein, codewords with multiple bit errors may be correctable by a system-level data protection component. However, if patrol scrubbing operations are separated by significant durations (e.g., 24-hour durations), the errors in a codeword may accumulate such that the errors in a codeword are no longer correctable by the patrol scrubbing operation. Such an accumulation of errors may occur rarely (e.g., on a yearly or multi-yearly basis), however, for certain applications (e.g., server clusters, hyperscalers, etc.), such errors may be especially damaging. For example, such errors may cause a complete reboot of a system (which may take up to thirty minutes), where a hyperscaler may aim to maintain continuous service for all but thirty minutes (or less) of a year.

To reduce the amount of errors in a memory module and to prevent correctable errors in the memory module from becoming uncorrectable errors, registers at memory devices in the memory module may be used to indicate, to a system-level component that performs a patrol scrubbing operation, addresses of corrupted codewords in respective memory devices. Additionally, or alternatively, a system-level device may identify address ranges within a memory module that are susceptible to errors and direct the memory devices at the memory module to repeatedly perform on-die scrubbing operations at the identified address spaces.

Features of the disclosure are initially described in the context of systems and subsystems. Features of the disclosure are also described in the context or process flows. These and other features of the disclosure are further illustrated by and described with reference to an apparatus diagram and flowcharts that relate to memory array error correction.

FIG. 1 illustrates an example of a system 100 that supports memory array error correction in accordance with examples as disclosed herein. The system 100 may include a host device 105, a memory module 110, and a plurality of channels 115 coupling the host device 105 with the memory module 110. The system 100 may include one or more memory modules 110, but aspects of the one or more memory modules 110 may be described in the context of a single memory device (e.g., memory module 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory module 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory module 110 may be an independent device or a component that is operable to provide physical memory addresses/space that may be used or referenced by the system 100. In some examples, a memory module 110 may be configurable to work with one or more different types of host devices. Signaling between the host device 105 and the memory module 110 may be operable to support one or more of: modulation schemes to modulate the signals, various pin configurations for communicating the signals, various form factors for physical packaging of the host device 105 and the memory module 110, clock signaling and synchronization between the host device 105 and the memory module 110, timing conventions, or other factors.

The memory module 110 may be operable to store data for the components of the host device 105. In some examples, the memory module 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory module 110 may include a module memory controller 155 and one or more memory devices 160 (e.g., memory chips) to support a desired capacity or a specified capacity for data storage. Each memory device 160 (e.g., memory device 160-a, memory device 160-b, memory device 160-N) may include a local memory controller 165 (e.g., local memory controller 165-a, local memory controller 165-b, local memory controller 165-N) and one or more memory arrays 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 160 including two or more memory dies may be referred to as a multi-die memory or a multi-die package or a multi-chip memory or a multi-chip package.

The module memory controller 155 may include circuits, logic, or components operable to control operation of the memory module 110. The module memory controller 155 may include the hardware, the firmware, or the instructions that enable the memory module 110 to perform various operations and may be operable to receive, transmit, or execute commands, data, or control information related to the components of the memory module 110. The module memory controller 155 may be operable to communicate with one or more of the external memory controller 120, the one or more memory devices 160, or the processor 125. In some examples, the module memory controller 155 may control operation of the memory module 110 described herein in conjunction with the local memory controller 165 of the memory device 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory device 160) may include circuits, logic, or components operable to control operation of the memory device 160. In some examples, a local memory controller 165 may be operable to communicate (e.g., receive or transmit data or commands or both) with the module memory controller 155. In some examples, a memory module 110 may not include a module memory controller 155, and a local memory controller 165 or the external memory controller 120 may perform various functions described herein. As such, a local memory controller 165 may be operable to communicate with the module memory controller 155, with other local memory controllers 165, or directly with the external memory controller 120, or the processor 125, or a combination thereof. Examples of components that may be included in the module memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the module memory controller 155 or local memory controller 165 or both.

The external memory controller 120 may be operable to enable communication of one or more of information, data, or commands between components of the system 100 or the host device 105 (e.g., the processor 125) and the memory module 110. The external memory controller 120 may convert or translate communications exchanged between the components of the host device 105 and the memory module 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory module 110, in some examples, the external memory controller 120, or its functions described herein, may be implemented by one or more components of a memory module 110 (e.g., a module memory controller 155, a local memory controller 165) or vice versa.

The components of the host device 105 may exchange information with the memory module 110 or memory devices 160 therein using one or more channels 115. The channels 115 may be operable to support communications between the external memory controller 120 and the memory module 110 or memory devices 160 therein. Each channel 115 may be examples of transmission mediums that carry information between the host device 105 and a memory device 160. In some cases, one or more of the channels 115 may be shared by multiple memory devices 160 of the memory module 110 (e.g., a channel 115 may be coupled with a corresponding pin at each of the memory devices 160). Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory module 110 or memory devices 160 therein. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more CA channels 186, one or more clock (CK) signal channels 188, one or more chip select (CS) channels 189, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a CK signal). In DDR signaling, two modulation symbols (e.g., signal levels) of a signal may be registered for each clock cycle (e.g., on both a rising edge and a falling edge of a CK signal).

In some examples, CA channels 186 may be operable to communicate commands between the host device 105 and the memory module 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths). In some examples, the CA channel 186 may be coupled to one or more CA pins included in each memory device 160.

In some examples, CK signal channels 188 may be operable to communicate one or more CK signals between the host device 105 and the memory module 110. Each CK signal may be operable to oscillate between a high state and a low state, and may support coordination (e.g., in time) between actions of the host device 105 and the memory module 110. In some examples, the CK signal may be single ended. In some examples, the CK signal may provide a timing reference for command and addressing operations for the memory module 110, or other system-wide operations for the memory module 110. A CK signal therefore may be referred to as a control CK signal, a command CK signal, or a system CK signal. A system CK signal may be generated by a system clock, which may include one or more hardware components (e.g., oscillators, crystals, logic gates, transistors). In some examples, the CK signal channel 188 may be coupled to one or more CK pins included in each memory device 160.

In some examples, a CS channel 189 may be operable to communicate one or more CS signals between the host device 105 and the memory module 110 The purpose of a CS signal may be to enable or disable a memory device 160 or a memory die therein. In some examples, the CS channel 189 may be coupled to one or more CS pins included in each memory device 160.

In some examples, data channels 190 may be operable to communicate one or more of data or control information between the host device 105 and the memory module 110. For example, the data channels 190 may communicate information (e.g., bi-directional) to be written to the memory module 110 or information read from the memory module 110.

The channels 115 may each include any quantity of signal paths (including a single signal path) coupled with any quantity of pins. In some examples, a channel 115 may include multiple individual signal paths. For example, a channel may be x4 (e.g., including four signal paths, and coupled with four corresponding pins at each of one or more memory devices 160), x8 (e.g., including eight signal paths, and coupled with eight corresponding pins at each of one or more memory devices 160), x16 (including sixteen signal paths, and coupled with sixteen corresponding pins at each of one or more memory devices 160), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes.

In some examples, a binary-symbol (or binary-level) modulation scheme may be used to modulate signals communicated between the host device 105 and the memory module 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), or others.

In some examples, a multi-symbol (or multi-level) modulation scheme may be used to modulate signals communicated between the host device 105 and the memory module 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

A memory module 110 may include data protection capabilities. For example, each memory device 160 may include a data protection component (e.g., a single-error correction, double-error detection (SECDED) error correction code (ECC) circuit) that is used to detect and, in some examples, correct errors in codewords that are accessed at a memory device 160. A data protection component at a memory device 160 may be referred to as an on-die data protection component. In some examples, based on receiving a command to write a set of data at a memory device 160, the memory device 160 may use an on-die data protection component to compute and store a set of syndrome bits (which may be referred to as a "stored set of syndrome bits") for the set of data concurrent with writing the set of data to a set of memory cells at the memory device 160.

After storing the set of data (which may be referred to as the "stored set of data"), the memory device 160 may receive a read command that addresses the set of memory cells used to store the stored set of data. Based on receiving the read command, the memory device 160 may access the stored set of data and compute a set of syndrome bits (which may be referred to as the "computed set of syndrome bits") for the accessed set of data. The memory device 160 may compare the computed set of syndrome bits with the stored set of syndrome bits to detect errors in the stored set of data—e.g., errors may be detected if there is a mismatch between the computed set of syndrome bits and the stored set of syndrome bits. Based on detecting an error, the memory device 160 may invert a bit of the accessed set of data (e.g., based on a result of the matching operation) to obtain and output a corrected set of data. The memory device 160 may not invert the bit in the stored set of data to correct the error within the memory device 160—e.g., due to latency constraints associated with writing the corrected set of data back to the memory device 160.

The memory device 160 may be configured to use respective on-die data protection components to fix errors in the memory devices 160—e.g., during a die-level scrubbing operation (which may be referred to as an "on-die scrubbing operation" or as an "on-die scrub"). During an on-die scrubbing operation, a memory device 160 may access (e.g., read) codewords stored in the memory device 160 and check the accessed codewords for errors using an on-die data protection component. For codewords that are detected as having errors, the on-die data protection component may output a corrected codeword after attempting to correct the errors in the codeword, and the memory device 160 may write the corrected codeword to a same set of memory cells from which the codeword was read.

An on-die scrubbing operation may be triggered automatically (e.g., every 24 hours) or manually (e.g., after being triggered by host device 105 or module memory controller 155). In both cases, the memory device 160 performing the on-die scrubbing operation may provide a sequence of addresses that is used by the on-die scrubbing operation when selecting which codewords to read from the memory device 160. In some examples, the memory device 160 begins the on-die scrubbing operation at an initial address (e.g., address 0) when an on-die scrubbing operation is triggered and increments a counter (e.g., initialized at 0) each time a codeword is accessed by the on-die scrubbing operation, where the updated value of the counter corresponds to the next address to be accessed by the on-die scrubbing operation.

An external memory controller 120 at host device 105, memory module 110, or both may be configured to fix errors in memory module 110—e.g., during a system-level scrubbing operation (which may be referred to as a "patrol scrubbing operation" or as a "patrol scrub"). During a patrol scrubbing operation, external memory controller 120 may read codewords stored in memory module 110 (e.g., across memory devices 160) and check the read codewords for errors using a system-level data protection component (e.g., a data protection component that implements a Reed-Solomon algorithm). The system-level data protection component may use symbol-based coding techniques and, thus, may provide symbol-level protection for data stored at memory module 110. In some examples, a system-level codeword is stored across multiple memory devices 160. For example, for a memory module 110 that includes five (5) memory devices 160, four (4) of the memory devices 160 may be used to store sixty-four (64) bits of a data portion of a system-level codeword, where each memory device 160 may store sixteen (16) bits of the data portion, and one (1) of the memory devices 160 may be used to store the bits of a data protection portion of the system-level codeword.

The system-level data protection component may be more powerful (e.g., able to detect and/or correct more errors) than the on-die data protection components. For example, the system-level data protection component may be able to recover data despite the corruption of an entire memory device 160. For codewords that are detected as having errors, the system-level data protection component may output a corrected codeword after attempting to correct the error in the codeword and the corrected codeword may be written back to a same set of memory cells from which the corrupted codeword was read. The patrol scrubbing operation may be triggered automatically or manually.

As described herein, a memory device 160 that uses an on-die data protection component to detect and, in some examples, correct errors in an accessed codeword during a read operation may not correct the corresponding codeword stored in the memory device 160. Also, on-die scrubbing operations performed by a memory device 160 may be separated by significant durations (e.g., 24-hour durations). Additionally, an on-die data protection component may be unable to correct more than one error in a codeword—e.g., if a SECDED data protection component is used. Accordingly, errors in codewords stored at memory module 110 that are correctable (e.g., codewords with single-bit errors) may become uncorrectable by the on-die data protection component (e.g., codewords with multi-bit errors) if additional errors are introduced between on-die scrubbing operations (e.g., due to neutron strikes, defects, short-circuits, disturbances, radiation, etc.). Moreover, during an on-die scrubbing operation, the on-die data protection component may introduce additional errors into codewords with multiple errors while attempting to correct these codewords—e.g., as a result of aliasing.

Codewords with multiple bit errors may be correctable by a system-level data protection component. However, if patrol scrubbing operations are separated by significant durations (e.g., 24-hour durations), the errors in a codeword may accumulate such that the errors in a codeword are no longer correctable by the patrol scrubbing operation. Such an accumulation of errors may occur rarely (e.g., on a yearly or multi-yearly basis), however, for certain applications (e.g., server clusters, hyperscalers, etc.), such errors may be especially damaging. For example, such errors may cause a complete reboot of a system (which may take up to thirty minutes), where a hyperscaler may aim to maintain continuous service for all but thirty minutes of a year.

To reduce the amount of errors in a memory module (such as memory module 110) and to prevent correctable errors in the memory module from becoming uncorrectable errors, registers at memory devices (such as memory devices 160) in the memory module may be used to indicate, to a system-level component that performs a patrol scrubbing operation, addresses of corrupted codewords in respective memory devices. Additionally, or alternatively, a system-level device (such as external memory controller 120 or module memory controller 155) may identify address ranges within a memory module that are susceptible to errors and direct the memory devices at the memory module to repeatedly perform on-die scrubbing operations at the identified address spaces.

Based on a register being used to indicate addresses of corrupted codewords, a local memory controller 165 at a memory device 160 may access a codeword—e.g., based on receiving a corresponding read command or while performing an on-die scrubbing operation. An on-die data protection component at the memory device 160 may detect that the codeword includes multiple bit errors. Based on detecting that the codeword includes multiple bit errors, the on-die data protection component or the local memory controller 165 may store the address of the codeword (or an address range that encompasses the address of the codeword) in a register (which may be referred to as a "scrubbing register") within memory module 110 (e.g., a register in memory device 160). Based on storing the address of the codeword in the scrubbing register, the local memory controller 165 may indicate to a system-level controller (e.g., module memory controller 155 or external memory controller 120) that the scrubbing register is storing one or more addresses (or address ranges)—e.g., via a data mask pin.

In response to the indication, a patrol scrubbing operation may be initiated—e.g., by external memory controller 120 or module memory controller 155. During the patrol scrubbing operation, the system-level data protection component may detect and correct errors in a system-level codeword that encompasses the data stored at the address of the corrupted die-level codeword, and the corrected system-level codeword may be written back to memory module 110. Accordingly, the corrupted die-level codeword may be corrected at the memory device 160.

By storing the addresses of corrupted codewords in a scrubbing register that is accessible by system-level controller, a patrol scrubbing operation may be opportunistically triggered to correct errors in one or more memory devices, preventing errors in the one or more memory devices from accumulating to a point that exceeds the capabilities of the system-level data protection component.

Based on a system-level device directing on-die scrubbing operations at a memory device, a system-level controller (e.g., external memory controller 120 or module memory controller 155) may monitor data received from the one or more memory devices 160 and identify areas (e.g., address spaces) of the one or more memory devices 160 that are susceptible to errors—e.g., areas that are outputting increased errors relative to other areas. The system-level controller may transmit a command that includes an indication for triggering an on-die scrubbing operation at one or more of the memory devices 160 and an address range for the on-die scrubbing operation. A memory device 160 that receives the command may initiate an on-die scrubbing operation at the addresses indicated in the command based on receiving the command. In some examples, the memory device 160 may delay an ongoing on-die scrubbing operation at the memory device 160 (e.g., a die-directed on-die scrubbing operation in accordance a set of addresses provided at the memory device 160) to perform a system-directed on-die scrubbing operation triggered by the received command in accordance with a set of addresses obtained from the system-level controller.

By enabling a system-level controller to trigger an on-die scrubbing operation at a set of addresses provided by the system-level controller (rather than a set of addresses provided by an die-level controller), the system-level controller may increase a frequency with which scrubbing operations are performed at problematic areas in a memory module, preventing errors in the problem areas from accumulating to a point that exceeds the capabilities of the system-level data protection component. Problematic areas may include overused or defective areas of a memory module that have degraded over an operating life of the memory module.

Both of the above options may reduce a frequency with which correctable errors at a memory module become uncorrectable errors, which may reduce pressure to improve a quality of a memory devices (e.g., by using more expensive or time-consuming procedures, more expensive components, etc.). Although described in the context of DRAM, aspects of this disclosure may be used for other memory technologies, such as FeRAM, compute express link (CXL) memory, or the like.

Figure 2:
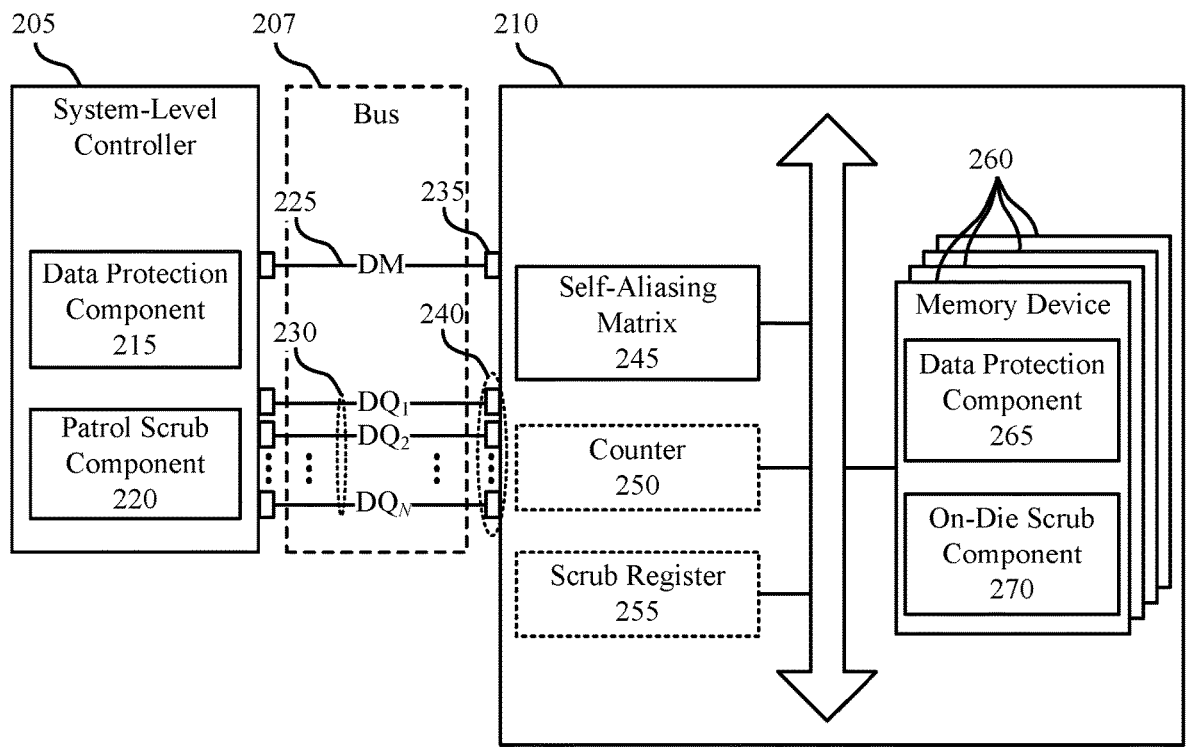
FIG. 2 illustrates an example of a subsystem that supports memory array error correction in accordance with examples as disclosed herein.

FIG. 2 illustrates an example of a subsystem that supports memory array error correction in accordance with examples as disclosed herein.

Subsystem 200 may include system-level controller 205, memory system 210, and bus 207. System-level controller 205 may be an example of an external memory controller 120 or module memory controller 155 of FIG. 1. System-level controller 205 may include system-level data protection component 215 and patrol scrub component 220. System-level controller 205 may include a data mask pin and data pins.

System-level data protection component 215 may be configured to detect and correct errors in data stored at memory system 210. System-level data protection component 215 may be capable of detecting and correcting codewords having multiple bit errors. System-level data protection component 215 may be configured to provide symbol-level protection. In some examples, system-level data protection component 215 may be configured to implement a Reed-Solomon data protection algorithm. System-level data protection component 215 may store information that supports the data protection functionality in one of the memory devices 260—e.g., a memory device dedicated to system-level data protection.

Patrol scrub component 220 may be configured to detect and correct errors in memory system 210—e.g., in combination with system-level data protection component 215. Patrol scrub component 220 may be configured to execute an operation for accessing portions of memory system 210 so that system-level data protection procedures can be applied to the accessed portions. Patrol scrub component 220 may be configured to execute the operation automatically (e.g., every 24 hours) or manually (e.g., if triggered by a user).

Memory system 210 may be an example of components of memory module 110 of FIG. 1. Memory system 210 may include memory devices 260, self-aliasing matrix 245, counter 250, and scrub register 255. Memory system 210 may also include data mask pin 235 and data pins 240.

Memory devices 260 may be examples of memory devices 160 of FIG. 1. Each of memory devices 260 may include one or more memory arrays, a die-level data protection component (e.g., die-level data protection component 265), and an on-die scrub component (e.g., on-die scrub component 270).

Die-level data protection component 265 may be configured to detect and correct errors in codewords stored in a memory device. In some examples, die-level data protection component 265 may be used during read operations to correct errors in accessed sets of data prior and to output a corrected set of data. Die-level data protection component 265 may be configured to detect multi-bit errors in codewords and to correct single-bit errors in codewords. In some examples, die-level data protection component 265 may detect a subset of multi-bit errors in codewords—that is, die-level data protection component 265 may fail to detect certain multiple bit errors in a codeword due to aliasing.

Die-level data protection component 265 may implement a SECDED ECC algorithm—e.g., using a Hamming matrix. To support data protection, die-level data protection component 265 may be used to generate a set of syndrome bits when a set of data is received for a write operation to an address of a memory device, where the set of syndrome bits are stored for the set of data. During a read operation, die-level data protection component 265 may be used to calculate a set of syndrome bits for a set of data accessed from the address of the memory device. The stored set of syndrome bits may be compared with the calculated set of syndrome bits (e.g., by die-level data protection component 265). If the sets of syndrome bits match, the comparison may result in a code of all 0s, and it may be determined that there are no errors in the accessed set of data. If the sets of syndrome bits are different, the comparison may result in a non-zero code, and it may be determined that there are one or more errors in the accessed set of data.

In some examples, the non-zero code indicates that there is a single-bit error in the codeword along with a location of the single-bit error in the codeword. In such cases, the single-bit error may be corrected—e.g., by inverting the bit. In some examples, the non-zero code indicates that there is a multi-bit error in the codeword along with a location of a single-bit error in the codeword. In such cases, if the non-zero code indicates a location of the single-bit error that is outside the range of available bit locations of the codeword, the multi-bit error may be detect but not corrected. However, if the non-zero code indicates a location of the single-bit error that is within the range of available bit locations of the codeword (which may be referred to as aliasing), the multi-bit error may be detected and an attempt to correct the multi-bit error may be made. The attempt to correct the multi-bit error may result in additional errors being introduced into the codeword.

On-die scrub component 270 may be configured to detect and correct errors in one of memory devices 260—e.g., in combination with die-level data protection component 265. On-die scrub component 270 may be configured to execute an operation for accessing portions of a corresponding memory device so that die-level data protection procedures can be applied to the accessed portions. On-die scrub component 270 may be configured to execute the operation automatically (e.g., every 24 hours) or manually (e.g., if triggered by system-level controller 205). On-die scrub component 270 may use counter 250 to support an on-die scrubbing operation. For example, a value of counter 250 (e.g., 0) may correspond to an address at a memory device (e.g., address 0), where, during an on-die scrubbing operation, on-die scrub component 270 may access the memory device at the corresponding address, perform a data protection procedure, and increment counter 250. On-die scrub component 270 may then access the memory device at a subsequent address, perform a data protection procedure, and increment counter 250. And so on. In some examples, each of the memory devices may include respective counters—e.g., counter 250 may be included within the memory device that includes die-level data protection component 265 and on-die scrub component 270.

Based on detecting a multi-bit error in one or more codewords during a scrubbing operation, on-die scrub component 270 may be configured to store an address of the one or more codewords in scrub register 255. Scrub register 255 may be configured to store M addresses or M/2 address ranges based on the detecting codewords. In some examples, on-die scrub component 270 may store an address of a corrupted codeword in scrub register 255 each time a corrupted codeword is identified. In other examples, on-die scrub component 270 may store an address range in scrub register 255 encompassing a set of corrupted codewords that are detected within a duration. In other examples, on-die scrub component 270 may store an address range in scrub register 255 encompassing a set of corrupted codewords once a threshold quantity of corrupted codewords are detected. Storing an address range in scrub register 255 may include storing a first address of the address range in a first location of scrub register 255 and a second address of the address range in a subsequent location of scrub register 255.

Self-aliasing matrix 245 may be configured to map data from one or more memory devices to data lines 230 such that a likelihood of that a majority (or all) of the errors in a system-level codeword will appear on a single data line will be increased. Decreasing a quantity of data lines 230 that are used to transmit bit errors may simplify a correction of the errors at system-level data protection component 215. In some examples, self-aliasing matrix 245 may be used to detect multi-bit errors in codewords that are to be transmitted.

Bus 207 may include data mask line 225 and data lines 230, which may be conductive traces, waveguides, wireless channels, or the like. Data mask line 225 may be used during write operations to indicate if a particular beat of a burst of data to be written to memory system 210 should be masked. Masking implies that the bits of data being masked should not replace the bits already existing in the array in the memory system 210. Data mask line 225 may be coupled with a data mask pin at system-level controller 205 and data mask pin 235. Data lines 230 may be used during read and write operations to communicate data between system-level controller 205 and memory system 210.

Based on storing one or more addresses in scrub register 255, on-die scrub component 270 may transmit, to system-level controller 205 an indication that there are codewords in memory system 210 having multiple bit errors using data mask pin 235—e.g., by applying a high voltage to the data mask pin 235—e.g., while concurrently communicating data to system-level controller 205 using data pins 240. Patrol scrub component 220 may initiate a patrol scrubbing operation based on receiving the indication over data mask line 225. As part of the patrol scrubbing operation, patrol scrub component 220 may transmit a command (e.g., multi-purpose command (MPC) or mode register read (MRR) command) to read scrub register 255, and information stored in scrub register 255 may be output to system-level controller 205 via data lines 230. In some examples, patrol scrub component 220 may initiate the patrol scrubbing operation at the one or more addresses (or address ranges) stored in scrub register 255. Performing a patrol scrubbing operation based on address information stored in a scrub register are described in more detail herein and with reference to FIG. 3.

In some examples, patrol scrub component 220 may monitor data received from memory system 210 and keep track of characteristics of accessed codewords received from memory system 210 that correspond to codewords stored in memory system 210 that have one or more errors. Based on the monitoring, patrol scrub component 220 may identify areas of memory system 210 (e.g., address ranges) that are susceptible to errors (e.g., areas that are associated with increased error rates relative to other areas). And patrol scrub component 220 may trigger on-die scrubbing operations at the identified areas—e.g., by transmitting a command to memory system 210 that includes an address range and a signal that triggers a memory device that includes the address range to perform an on-die scrubbing operation at locations corresponding to the address range. System-directed on-die scrubbing operations are described in more detail herein and with reference to FIG. 4.

Figure 3:
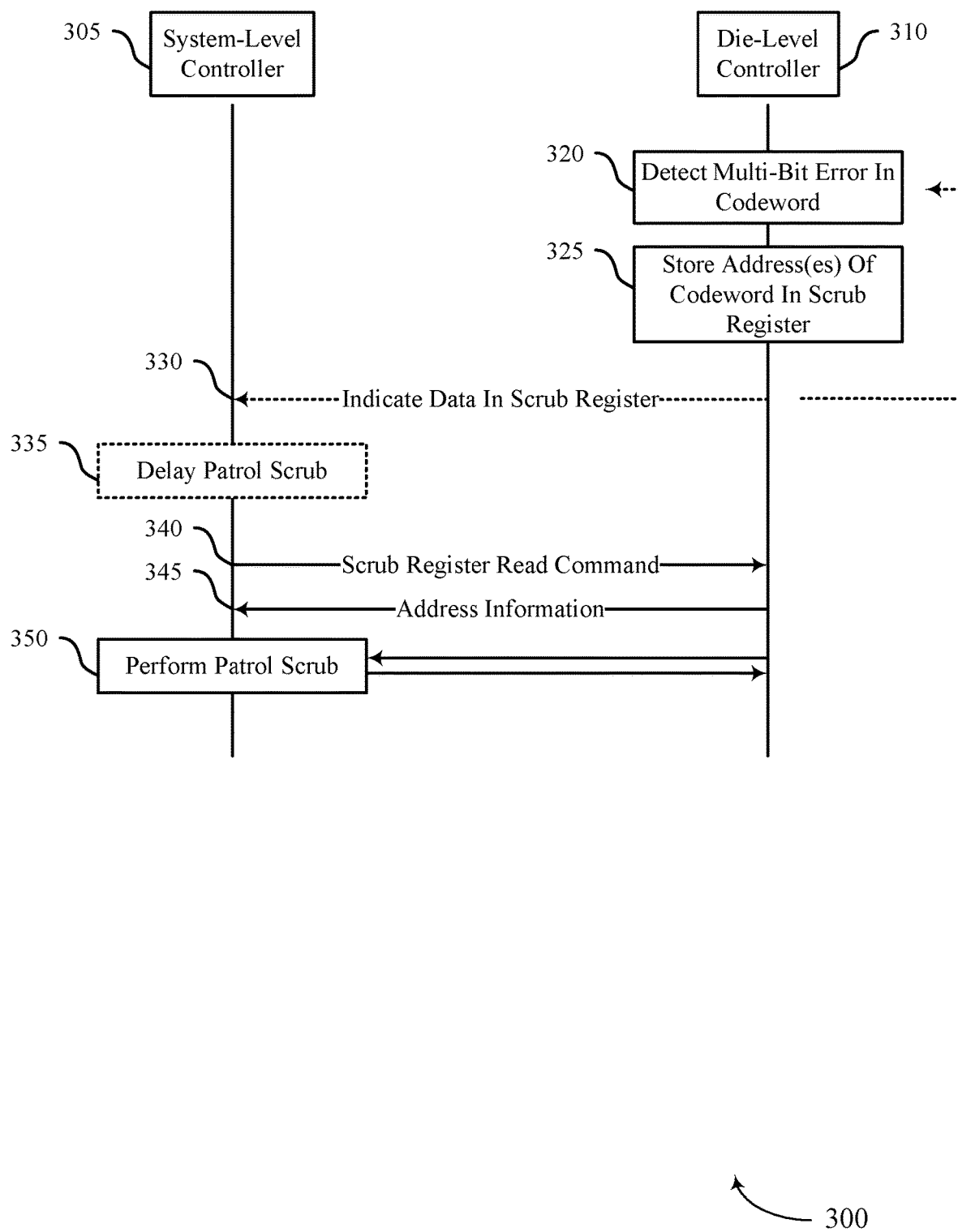
FIGS. 3 and 4 illustrate example sets of operations that support memory array error correction in accordance with examples as disclosed herein.

FIG. 3 illustrates an example of a set of operations that supports memory array error correction in accordance with examples as disclosed herein.

Process flow 300 may be performed by system-level controller 305 and die-level controller 310. System-level controller 305 may be an example of an external memory controller or a module memory controller of FIG. 1 or a system-level controller of FIG. 2. Die-level controller 310 may be an example of a local memory controller of FIG. 1. In some examples, process flow 300 illustrates an exemplary sequence of operations performed to support memory array error correction. For example, process flow 300 depicts operations for performing a patrol scrubbing operation that is based on address information stored in a scrub register.

One or more of the operations described in process flow 300 may be performed earlier or later in the process, omitted, replaced, supplemented, or combined with another operation. Also, additional operations described herein that are not included in process flow 300 may be included.

At 320, die-level controller 310 may detect a multi-bit error in an accessed codeword. In some examples, die-level controller 310 detects the multi-bit error after executing a read operation in response to receiving a read command that addressed the codeword. In other examples, die-level controller 310 detects the multi-bit error after accessing the codeword as part of an ongoing on-die scrubbing operation. In some examples, die-level controller 310 detects the multi-bit error based on an error code being generated by on-die data protection circuitry that points to a non-existent bit location in the codeword.

At 325, die-level controller 310 may store address information associated with a codeword detected as having a multi-bit error in a scrub register (such as scrub register 255 of FIG. 2) In some examples, die-level controller 310 may store, in the scrub register, one or more addresses of one or more corrupted codewords—e.g., as the corrupted codewords are detected. In other examples, die-level controller 310 may store, in the scrub register, an address range that encompasses one or more corrupted codewords—e.g., after a duration elapses or after a threshold quantity of corrupted codewords are detected. In some examples, die-level controller 310 stores addresses and address ranges in the scrub register—e.g., die-level controller 310 may store address ranges in the scrub register after a threshold quantity of address are stored in the scrub register. Also, in some examples, die-level controller 310 may periodically consolidate addresses stored in the scrub register—e.g., if a threshold quantity of addresses within an address range are stored in the scrub register, die-level controller 310 may store the address range in place of the stored addresses.

At 330, die-level controller 310 may indicate to system-level controller 305 that the scrub register is storing address information/is not empty. To indicate that the scrub register is not empty, die-level controller 310 may transmit an indication to system-level controller 305—e.g., by applying a voltage to a line between system-level controller 305 and die-level controller 310 that remains inactive during a read operation (such as data mask line 225). In some examples, die-level controller 310 transmits the indication concurrently with the transmission of data requested by a read command received from system-level controller 305. Before, during, or after indicating the status of scrub register to system-level controller 305, die-level controller 310 may continue to search for and detect multi-bit errors in accessed codewords as well as store address of detected codewords that have multi-bit errors.

At 335, system-level controller 305 may delay a patrol scrubbing operation after receiving the indication that there is data in the scrub register. In such cases, system-level controller 305 may refrain from transmit a command for reading the scrub register. System-level controller 305 may delay the patrol scrubbing operation if a quantity of data ready to be transmitted to a memory system that includes die-level controller 310 exceeds a threshold, if a rate of access of the memory system exceeds a threshold, or both. System-level controller 305 may delay the patrol scrubbing operation until a lower-activity period or a duration associated with lower access rates. In some examples, system-level controller 305 may delay the patrol scrubbing operation after reading the scrub register—e.g., if the scrub register indicates a large quantity of addresses.

At 340, system-level controller 305 may transmit a command to read the scrub register (which may be referred to as a "scrub register read command") to die-level controller 310.

System-level controller 305 may transmit the command in response to receiving the indication that the scrub register is storing address information. System-level controller 305 may transmit the command based on a delay period for the patrol scrubbing operation expiring.

At 345, die-level controller 310 may transmit, to system-level controller 305, address information stored in the scrub register (e.g., via a set of data lines). The address information may include a set of addresses corresponding to corrupted codewords stored in one or more memory devices, a range of address corresponding to corrupted codewords stored in one or more memory devices, or both. In some examples, die-level controller 310 erases the address information stored in the scrub register after transmitting the address information to system-level controller 305.

At 350, system-level controller 305 may perform a patrol scrubbing operation based on the address information received from die-level controller 310. During the patrol scrubbing operation, system-level controller 305 may access system-level codewords associated with the indicated addresses of the corrupted codewords. System-level controller 305 may further detect and correct (using symbol correction techniques) the multi-bit errors in the codewords and write corrected system-level codewords to the memory system; thus, correcting the multi-bit errors in the corrupted codewords.

Figure 4:
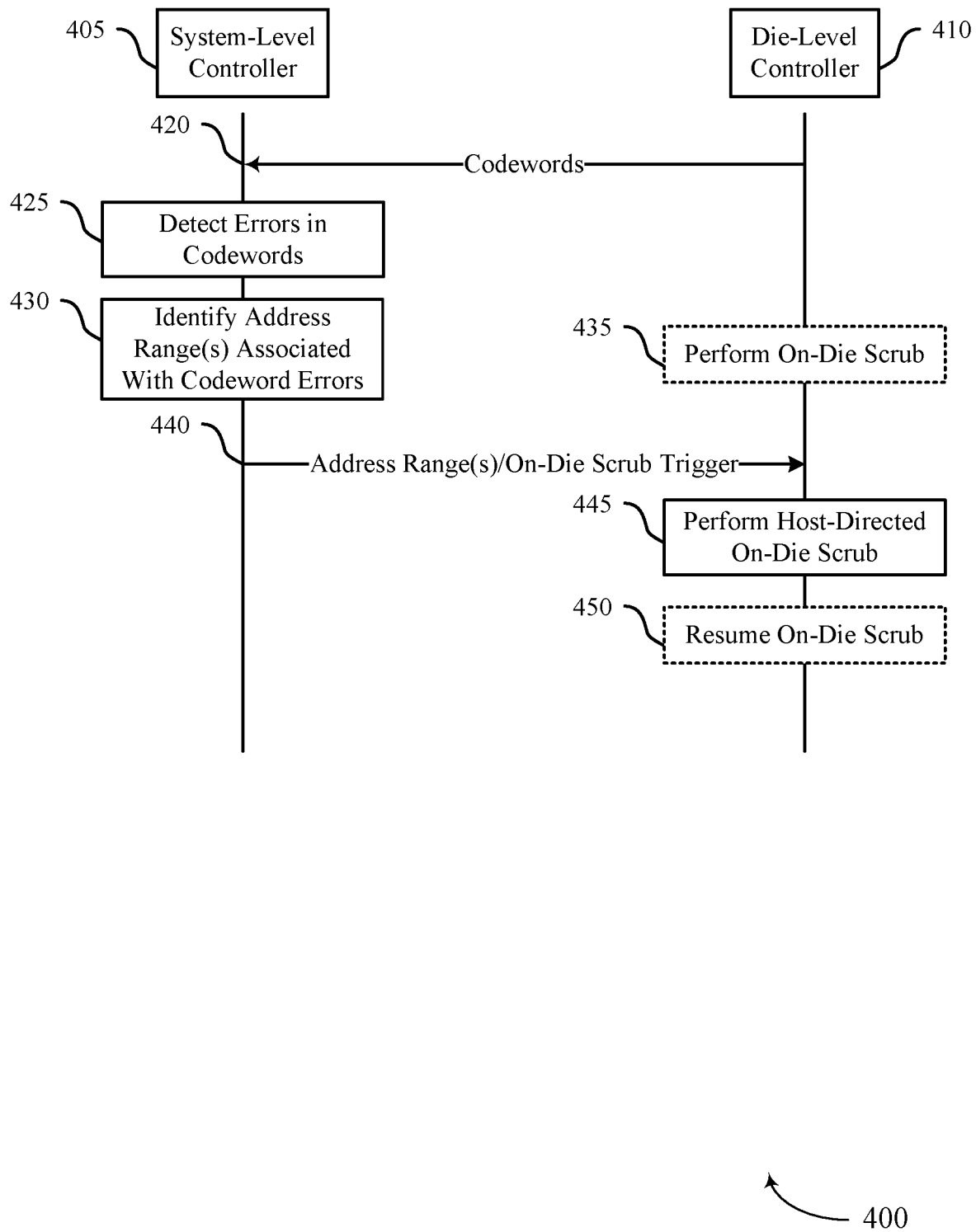

FIG. 4 illustrates an example of a set of operations that supports memory array error correction in accordance with examples as disclosed herein.

Process flow 400 may be performed by system-level controller 405 and die-level controller 410. System-level controller 405 may be an example of an external memory controller or a module memory controller of FIG. 1 or a system-level controller of FIG. 2 or 3. Die-level controller 410 may be an example of a local memory controller of FIG. 1 or a die-level controller of FIG. 3. In some examples, process flow 400 illustrates an exemplary sequence of operations performed to support memory array error correction. For example, process flow 400 depicts operations for performing a system-directed on-die scrubbing operation.

One or more of the operations described in process flow 400 may be performed earlier or later in the process, omitted, replaced, supplemented, or combined with another operation. Also, additional operations described herein that are not included in process flow 400 may be included.

At 420, die-level controller 410 may transmit codewords to system-level controller 405 throughout an operational period. In some examples, die-level controller 410 transmits the codewords to system-level controller 405 in response to read commands received from system-level controller 405, as part of executing a program at die-level controller 410, or the like. System-level controller 405 may similarly receive codewords from die-level controllers that are within other memory devices than die-level controller 410.

At 425, system-level controller 405 may detect errors in a subset of the codewords received from die-level controller 410. Detecting the errors may include receiving an indication from die-level controller 410 of codewords that include errors—e.g., die-level controller 410 may concurrently transmit an indication that an error in a codeword has been corrected with a transmission of the codeword. Additionally, or alternatively, detecting the errors may include detecting, by a data protection component at the system-level controller 405, errors in system-level codewords associated with the received codewords. System-level controller 405 may keep track of the addresses associated with the corrupted codewords—e.g., may store the addresses of the corrupted codewords.

At 430, system-level controller 405 may identify one or more address ranges associated with the corrupted codewords—e.g., based on analyzing the addresses of the corrupted codewords. In some examples, each of the one or more address ranges may correspond to a respective memory device—e.g., a first address range may be within a first memory device, a second address range may be within a second memory device and so on.

At 435, die-level controller 410 may initiate and perform an on-die scrubbing operation. The on-die scrubbing operation may be initiated based on a scheduled event occurring (e.g., a duration since the last on-die scrubbing operation exceeding a threshold). For the on-die scrubbing operation, die-level controller 410 may access codewords in accordance with a sequence of addresses stored or generated at die-level controller 410. For example, die-level controller 410 may use a counter that is incremented each time a codeword is accessed to determine a next address to access for the on-die scrubbing operation. In other examples, die-level controller 410 may access the codewords in accordance with a list of addresses. In other examples, die-level controller 410 may access the codewords in accordance with a pattern of address—e.g., die-level controller 410 may access a first codeword in each memory bank, then a last codeword in each memory bank, then a second codework in each memory bank, and so on.

At 440, system-level controller 405 may transmit a command to die-level controller 410, where the command includes a trigger for an on-die scrubbing operation at the one or more address ranges. The command may indicate an address range (e.g., by including a first address of the address range and a second address of the address range). In some examples, system-level controller 405 transmits multiple of the commands, where each command includes a respective address range of the one or more address ranges.

At 445, die-level controller 410 may initiate a system-directed on-die scrubbing operation based on based on receiving a command from system-level controller 405. Die-level controller 410 may perform the system-directed on-die scrubbing operation at a set of addresses indicated in the received command. In some examples, die-level controller 410 may delay, pause, or interrupt an ongoing on-die scrubbing operation (e.g., if an on-die scrubbing operation is initiated prior to receiving the command) to perform the system-directed on-die scrubbing operation based on receiving the command from system-level controller 405. Accordingly, die-level controller 410 may perform an on-die scrubbing operation at addresses provided by system-level controller 405, rather than by a set of address provided at a memory device that includes die-level controller 410.

At 450, die-level controller 410 may resume a paused on-die scrubbing operation based on completing the system-directed on-die scrubbing operation.

Figure 5:
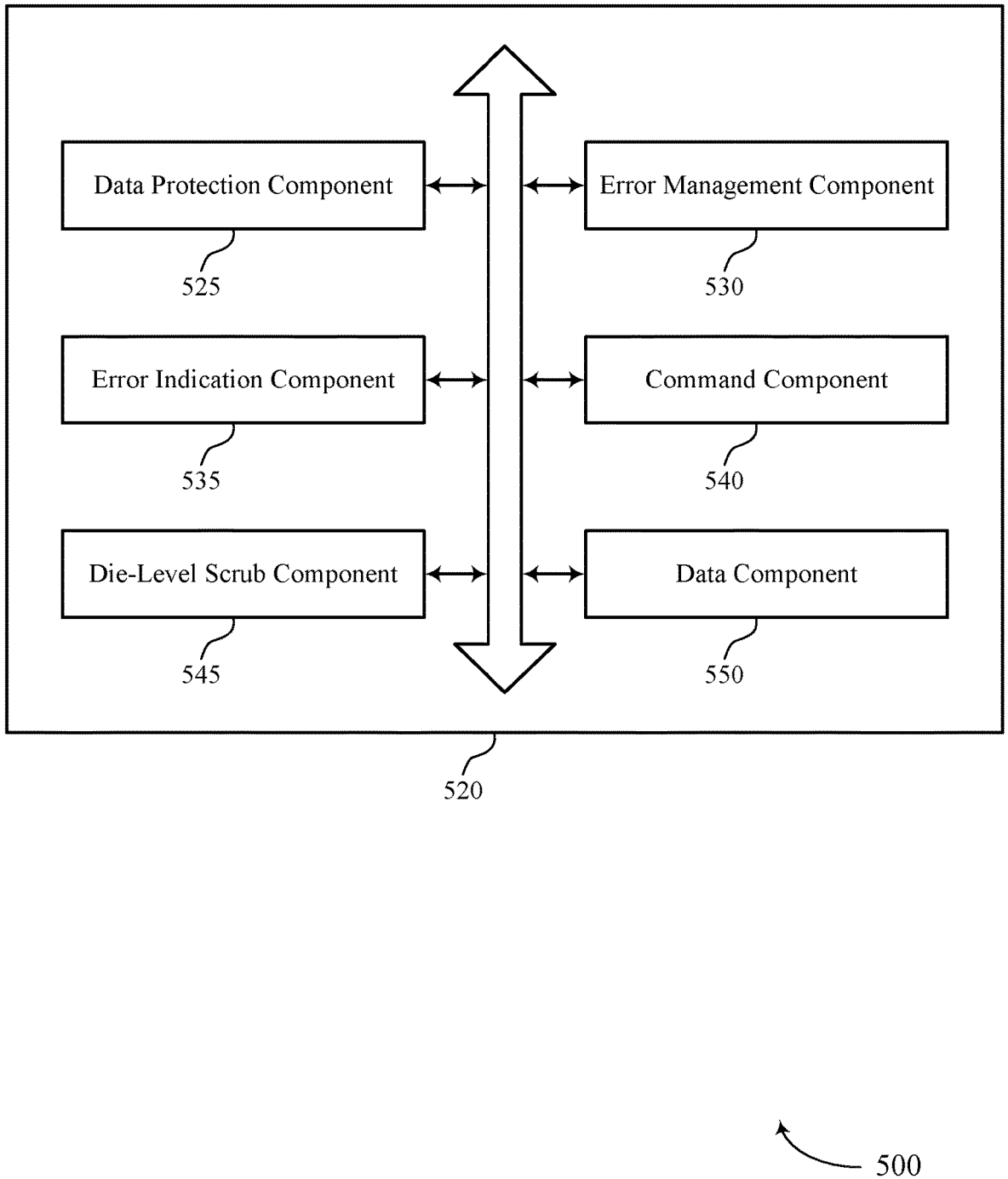
FIG. 5 shows a block diagram of a memory device that supports memory array error correction in accordance with examples as disclosed herein.

FIG. 5 shows a block diagram 500 of a memory device 520 that supports memory array error correction in accordance with examples as disclosed herein. The memory device 520 may be an example of aspects of a memory device as described with reference to FIGS. 1 through 4. The memory device 520, or various components thereof, may be an example of means for performing various aspects of memory array error correction as described herein. For example, the memory device 520 may include a data protection component 525, an error management component 530, an error indication component 535, a command component 540, a die-level scrub component 545, a data component 550, or any combination thereof. Each of these components may communicate, directly or indirectly, with one another (e.g., via one or more buses).

In some examples, a memory device 520 may store addresses of corrupted codewords in a register and trigger a patrol scrub at a controller of the memory device based on the stored addresses. The data protection component 525 may be configured as or otherwise support a means for detecting, at a memory device including a memory array, that a codeword has a plurality of bit errors, the codeword being associated with a set of data stored in the memory array. The error management component 530 may be configured as or otherwise support a means for storing, based at least in part on detecting that the codeword has the plurality of bit errors, an address of a location of the memory array used to store the codeword. The error indication component 535 may be configured as or otherwise support a means for indicating, to a host device based at least in part on storing the address, that one or more codewords stored in the memory array each include multiple bit errors, the one or more codewords including the codeword. The command component 540 may be configured as or otherwise support a means for receiving, from the host device based at least in part on the indicating, a write command for writing a second codeword to the address of the memory array, the second codeword being associated with the set of data.

In some examples, the command component 540 may be configured as or otherwise support a means for receiving a read command including the address. In some examples, the data component 550 may be configured as or otherwise support a means for retrieving the codeword from the location in the memory array based at least in part on the address of the read command. In some examples, the data protection component 525 may be configured as or otherwise support a means for performing a data protection operation on the codeword based at least in part on retrieving the codeword, where detecting that the codeword has the plurality of bit errors is based at least in part on the data protection operation.

In some examples, the command component 540 may be configured as or otherwise support a means for receiving, from the host device based at least in part on the indicating, a read command including the address of the memory array. In some examples, the data component 550 may be configured as or otherwise support a means for transmitting, based at least in part on receiving the read command, the codeword to the host device.

In some examples, to support storing the address, the error management component 530 may be configured as or otherwise support a means for writing the address to a register of the memory device.

In some examples, the command component 540 may be configured as or otherwise support a means for receiving, from the host device based at least in part on the indicating, a request to read the register. In some examples, the data component 550 may be configured as or otherwise support a means for transmitting, to the host device, the address based at least in part on receiving the request, where receiving the write command is based at least in part on transmitting the address.

In some examples, the data protection component 525 may be configured as or otherwise support a means for detecting that a third codeword has a second plurality of bit errors, the third codeword being associated with a second set of data stored in the memory array. In some examples, the error management component 530 may be configured as or otherwise support a means for writing, to the register and based at least in part on detecting that the third codeword has the second plurality of bit errors, a second address of a second location of the memory array used to store the third codeword. In some examples, the command component 540 may be configured as or otherwise support a means for receiving, from the host device based at least in part on the indicating, a request to read the register. In some examples, the data component 550 may be configured as or otherwise support a means for transmitting, to the host device, the address and the second address based at least in part on receiving the request, where receiving the write command is based at least in part on transmitting the address and the second address.

In some examples, to support indicating that the one or more codewords stored in the memory array respectively include multiple bit errors, the error indication component 535 may be configured as or otherwise support a means for applying a voltage to a pin that is coupled with a bus that connects the host device to the memory array, where the pin is configured to be idle during read operations. In some examples, the pin is a data mask pin of the memory device.

In some examples, a host device may identify areas within the memory device 520 that are susceptible to errors, and the memory device 520 may receive an address range from the host device for use in an on-die scrubbing operation based on the identified areas. In some examples, the command component 540 may be configured as or otherwise support a means for receiving, at a memory device including a memory array, a command from a host device, the command including a set of addresses of the memory array and a trigger for a procedure for correcting errors in codewords stored at the set of addresses. The die-level scrub component 545 may be configured as or otherwise support a means for initiating, by the memory device, the procedure based at least in part on the command. In some examples, the data protection component 525 may be configured as or otherwise support a means for accessing, as part of the procedure, locations of the memory array at the set of addresses based at least in part on receiving the command including the set of addresses. In some examples, the data protection component 525 may be configured as or otherwise support a means for correcting, as part of the procedure, codewords at one or more of the locations of the memory array based at least in part on the accessing.

In some examples, the die-level scrub component 545 may be configured as or otherwise support a means for initiating a second procedure associated with correcting errors in codewords stored at the memory array. In some examples, the data protection component 525 may be configured as or otherwise support a means for accessing, as part of the second procedure, second locations of the memory array at addresses of the memory array in accordance with a sequence of addresses of the memory array.

In some examples, to support accessing the addresses of the sequence of addresses, the data protection component 525 may be configured as or otherwise support a means for accessing a plurality of locations of the memory array corresponding to the addresses of the sequence of addresses based at least in part on a value of a counter associated with the second procedure, where values of the counter correspond to respective addresses of the sequence of addresses, and where the counter is incremented each time a location of the plurality of locations is accessed as part of the second procedure.

In some examples, the second procedure is initiated prior to receiving the command from the host device, and the die-level scrub component 545 may be configured as or otherwise support a means for pausing the second procedure based at least in part on receiving the command, where the locations of the memory array at the set of addresses are accessed as part of the procedure based at least in part on pausing the second procedure.

In some examples, the die-level scrub component 545 may be configured as or otherwise support a means for resuming the second procedure based at least in part on completing the procedure. In some examples, the data protection component 525 may be configured as or otherwise support a means for accessing, based at least in part on resuming the second procedure, third locations of the memory array at second addresses of the sequence of addresses of the memory array.

In some examples, the die-level scrub component 545 may be configured as or otherwise support a means for determining, based at least in part on initiating the second procedure, a first value of a counter associated with the second procedure, where accessing the sequence of addresses as part of the second procedure includes. In some examples, the data protection component 525 may be configured as or otherwise support a means for accessing a first location of the memory array at a first address corresponding to the first value of the counter, the sequence of addresses including the first address. In some examples, the die-level scrub component 545 may be configured as or otherwise support a means for incrementing the counter based at least in part on accessing the first location, the counter having a second value based at least in part on the incrementing a first time. In some examples, the data protection component 525 may be configured as or otherwise support a means for accessing a second location of the memory array at a second address corresponding to the second value of the counter. In some examples, the die-level scrub component 545 may be configured as or otherwise support a means for incrementing the counter based at least in part on accessing the second location, the counter having a third value based at least in part on the incrementing the counter a second time.

In some examples, to support accessing the set of addresses as part of the procedure, the data protection component 525 may be configured as or otherwise support a means for accessing, based at least in part on pausing the second procedure after accessing the second location of the memory array, a third location of the memory array at an address of the set of addresses, the address of the set of addresses being different than a third address of the memory array corresponding to the third value of the counter.

In some examples, a memory device 520 may store address ranges that encompass addresses of corrupted codewords in a register and trigger a patrol scrub at a controller of the memory device based on the stored address ranges. In some examples, the data protection component 525 may be configured as or otherwise support a means for detecting, at a memory device including a memory array, that a first plurality of codewords each have a plurality of bit errors, codewords of the first plurality of codewords being associated with respective sets of data stored in the memory array. In some examples, the error management component 530 may be configured as or otherwise support a means for storing, based at least in part on detecting that the first plurality of codewords each have the plurality of bit errors, a range of addresses corresponding to a range of locations of the memory array used to store a set of codewords, the set of codewords including the first plurality of codewords. In some examples, the error indication component 535 may be configured as or otherwise support a means for indicating, to a host device based at least in part on storing the range of addresses, that at least one codeword stored in the memory array includes multiple bit errors. In some examples, the command component 540 may be configured as or otherwise support a means for receiving, from the host device based at least in part on the indicating, one or more write commands for writing a second plurality of codewords to a plurality of addresses of the range of addresses, the codewords of the second plurality of codewords being associated with the respective sets of data.

In some examples, to support storing the range of addresses, the error management component 530 may be configured as or otherwise support a means for storing, in a register, a first address of the memory array and a second address of the memory array based at least in part on detecting that the first plurality of codewords each have a plurality of errors, the range of addresses including addresses between the first address of the memory array and the second address of the memory array.

In some examples, the data protection component 525 may be configured as or otherwise support a means for detecting, at the memory device, that a third plurality of codewords each have a second plurality of bit errors, codewords of the third plurality of codewords being associated with respective second sets of data stored in the memory array. In some examples, the error management component 530 may be configured as or otherwise support a means for storing, based at least in part on detecting that the third plurality of codewords each have the second plurality of bit errors, a second range of addresses corresponding to a second range of locations of the memory array used to store a second set of codewords, the second set of codewords including the second plurality of codewords.

In some examples, the command component 540 may be configured as or otherwise support a means for receiving, from the host device based at least in part on the indicating, one or more second write commands for writing a fourth plurality of codewords to a second plurality of addresses of the second range of addresses, the codewords of the fourth plurality of codewords being associated with the respective second sets of data.

In some examples, to support indicating that the at least one codeword stored in the memory array includes multiple bit errors, the error indication component 535 may be configured as or otherwise support a means for applying a voltage to a pin that is coupled with a bus that connects the host device to the memory array, where the pin is configured to be idle during read operations.

Figure 6:
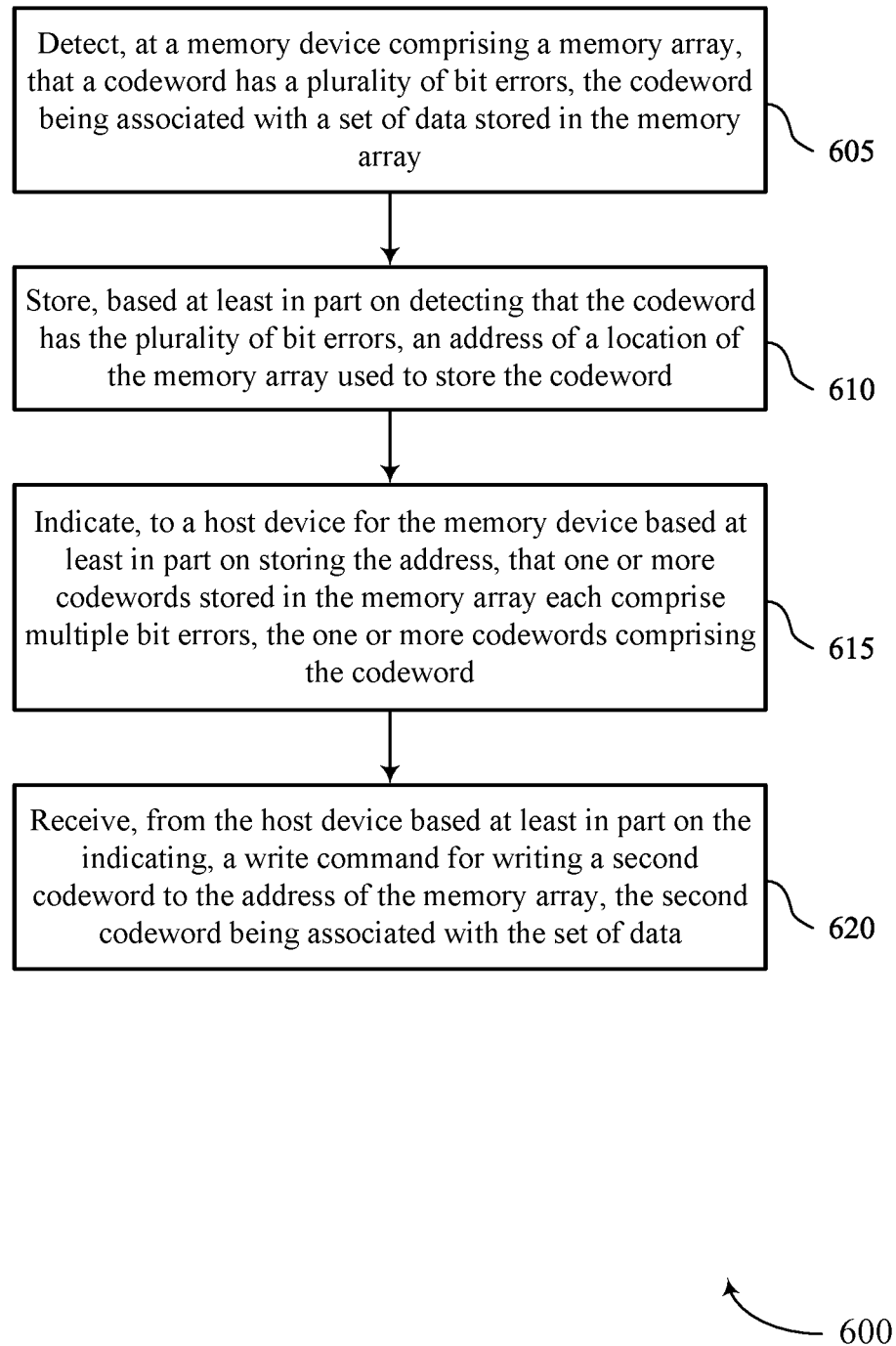
FIGS. 6 through 8 show flowcharts illustrating a method or methods that support memory array error correction in accordance with examples as disclosed herein.

FIG. 6 shows a flowchart illustrating a method 600 that supports memory array error correction in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 605, the method may include detecting, at a memory device including a memory array, that a codeword has a plurality of bit errors, the codeword being associated with a set of data stored in the memory array. The operations of 605 may be performed in accordance with examples as disclosed herein. In some examples, aspects of the operations of 605 may be performed by a data protection component 525 as described with reference to FIG. 5.

At 610, the method may include storing, based at least in part on detecting that the codeword has the plurality of bit errors, an address of a location of the memory array used to store the codeword. The operations of 610 may be performed in accordance with examples as disclosed herein. In some examples, aspects of the operations of 610 may be performed by an error management component 530 as described with reference to FIG. 5.

At 615, the method may include indicating, to a host device for the memory device based at least in part on storing the address, that one or more codewords stored in the memory array each include multiple bit errors, the one or more codewords including the codeword. The operations of 615 may be performed in accordance with examples as disclosed herein. In some examples, aspects of the operations of 615 may be performed by an error indication component 535 as described with reference to FIG. 5.

At 620, the method may include receiving, from the host device based at least in part on the indicating, a write command for writing a second codeword to the address of the memory array, the second codeword being associated with the set of data. The operations of 620 may be performed in accordance with examples as disclosed herein. In some examples, aspects of the operations of 620 may be performed by a command component 540 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor), or any combination thereof for performing the following aspects of the present disclosure:

Aspect 1: The apparatus, including features, circuitry, logic, means, or instructions, or any combination thereof for detecting, at a memory device including a memory array, that a codeword has a plurality of bit errors, the codeword being associated with a set of data stored in the memory array; storing, based at least in part on detecting that the codeword has the plurality of bit errors, an address of a location of the memory array used to store the codeword; indicating, to a host device based at least in part on storing the address, that one or more codewords stored in the memory array each include multiple bit errors, the one or more codewords including the codeword; and receiving, from the host device based at least in part on the indicating, a write command for writing a second codeword to the address of the memory array, the second codeword being associated with the set of data.

Aspect 2: The apparatus of aspect 1, further including operations, features, circuitry, logic, means, or instructions, or any combination thereof for receiving a read command including the address; retrieving the codeword from the location in the memory array based at least in part on the address of the read command; and performing a data protection operation on the codeword based at least in part on retrieving the codeword, where detecting that the codeword has the plurality of bit errors is based at least in part on the data protection operation.

Aspect 3: The apparatus of any of aspects 1 through 2, further including operations, features, circuitry, logic, means, or instructions, or any combination thereof for receiving, from the host device based at least in part on the indicating, a read command including the address of the memory array and transmitting, based at least in part on receiving the read command, the codeword to the host device.

Aspect 4: The apparatus of any of aspects 1 through 3 where storing the address, further includes operations, features, circuitry, logic, means, or instructions, or any combination thereof for writing the address to a register of the memory device.

Aspect 5: The apparatus of aspect 4, further including operations, features, circuitry, logic, means, or instructions, or any combination thereof for receiving, from the host device based at least in part on the indicating, a request to read the register and transmitting, to the host device, the address based at least in part on receiving the request, where receiving the write command is based at least in part on transmitting the address.

Aspect 6: The apparatus of any of aspects 4 through 5, further including operations, features, circuitry, logic, means, or instructions, or any combination thereof for detecting that a third codeword has a second plurality of bit errors, the third codeword being associated with a second set of data stored in the memory array; writing, to the register and based at least in part on detecting that the third codeword has the second plurality of bit errors, a second address of a second location of the memory array used to store the third codeword; receiving, from the host device based at least in part on the indicating, a request to read the register; and transmitting, to the host device, the address and the second address based at least in part on receiving the request, where receiving the write command is based at least in part on transmitting the address and the second address.

Aspect 7: The apparatus of any of aspects 1 through 6 where indicating that the one or more codewords stored in the memory array respectively include multiple bit errors, further includes operations, features, circuitry, logic, means, or instructions, or any combination thereof for applying a voltage to a pin that is coupled with a bus that connects the host device to the memory array, where the pin is configured to be idle during read operations.

Aspect 8: The apparatus of aspect 7, further including operations, features, circuitry, logic, means, or instructions, or any combination thereof for the pin is a data mask pin of the memory device.

Figure 7:
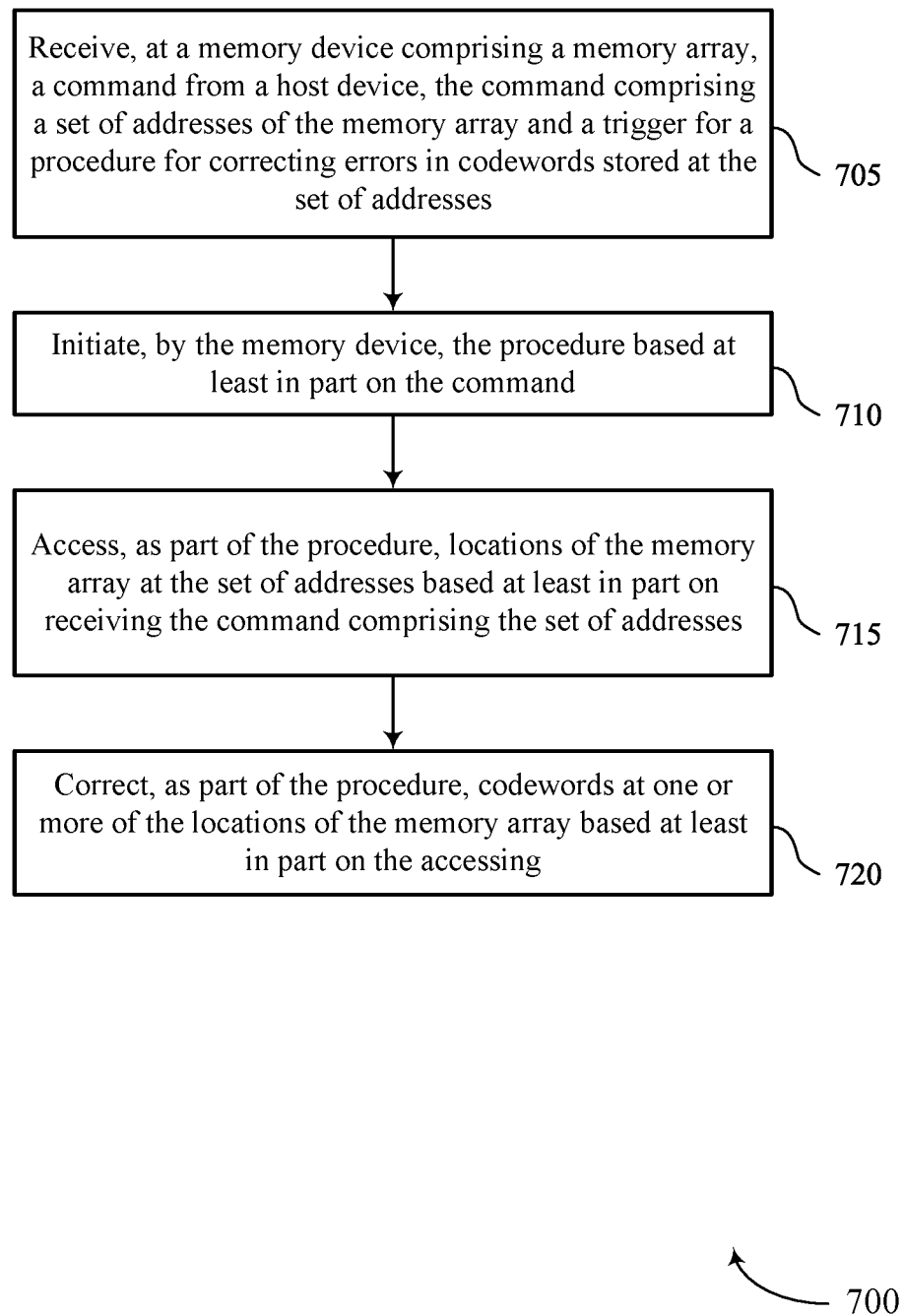

FIG. 7 shows a flowchart illustrating a method 700 that supports memory array error correction in accordance with examples as disclosed herein. The operations of method 700 may be implemented by a memory device or its components as described herein. For example, the operations of method 700 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 705, the method may include receiving, at a memory device including a memory array, a command from a host device, the command including a set of addresses of the memory array and a trigger for a procedure for correcting errors in codewords stored at the set of addresses. The operations of 705 may be performed in accordance with examples as disclosed herein. In some examples, aspects of the operations of 705 may be performed by a command component 540 as described with reference to FIG. 5.

At 710, the method may include initiating, by the memory device, the procedure based at least in part on the command. The operations of 710 may be performed in accordance with examples as disclosed herein. In some examples, aspects of the operations of 710 may be performed by a die-level scrub component 545 as described with reference to FIG. 5.

At 715, the method may include accessing, as part of the procedure, locations of the memory array at the set of addresses based at least in part on receiving the command including the set of addresses. The operations of 715 may be performed in accordance with examples as disclosed herein. In some examples, aspects of the operations of 715 may be performed by a data protection component 525 as described with reference to FIG. 5.

At 720, the method may include correcting, as part of the procedure, codewords at one or more of the locations of the memory array based at least in part on the accessing. The operations of 720 may be performed in accordance with examples as disclosed herein. In some examples, aspects of the operations of 720 may be performed by a data protection component 525 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor), or any combination thereof for performing the following aspects of the present disclosure:

Aspect 9: The apparatus, including features, circuitry, logic, means, or instructions, or any combination thereof for receiving, at a memory device including a memory array, a command from a host device, the command including a set of addresses of the memory array and a trigger for a procedure for correcting errors in codewords stored at the set of addresses; initiating, by the memory device, the procedure based at least in part on the command; accessing, as part of the procedure, locations of the memory array at the set of addresses based at least in part on receiving the command including the set of addresses; and correcting, as part of the procedure, codewords at one or more of the locations of the memory array based at least in part on the accessing.

Aspect 10: The apparatus of aspect 9, further including operations, features, circuitry, logic, means, or instructions, or any combination thereof for initiating a second procedure associated with correcting errors in codewords stored at the memory array and accessing, as part of the second procedure, second locations of the memory array at addresses of the memory array in accordance with a sequence of addresses of the memory array.

Aspect 11: The apparatus of aspect 10 where accessing the addresses of the sequence of addresses, further includes operations, features, circuitry, logic, means, or instructions, or any combination thereof for accessing a plurality of locations of the memory array corresponding to the addresses of the sequence of addresses based at least in part on a value of a counter associated with the second procedure, where values of the counter correspond to respective addresses of the sequence of addresses, and where the counter is incremented each time a location of the plurality of locations is accessed as part of the second procedure.

Aspect 12: The apparatus of any of aspects 10 through 11 where the second procedure is initiated prior to receiving the command from the host device and the method, apparatuses, and non-transitory computer-readable medium, further includes operations, features, circuitry, logic, means, or instructions, or any combination thereof for pausing the second procedure based at least in part on receiving the command, where the locations of the memory array at the set of addresses are accessed as part of the procedure based at least in part on pausing the second procedure.

Aspect 13: The apparatus of aspect 12, further including operations, features, circuitry, logic, means, or instructions, or any combination thereof for resuming the second procedure based at least in part on completing the procedure and accessing, based at least in part on resuming the second procedure, third locations of the memory array at second addresses of the sequence of addresses of the memory array.

Aspect 14: The apparatus of any of aspects 12 through 13, further including operations, features, circuitry, logic, means, or instructions, or any combination thereof for determining, based at least in part on initiating the second procedure, a first value of a counter associated with the second procedure, where accessing the sequence of addresses as part of the second procedure includes; accessing a first location of the memory array at a first address corresponding to the first value of the counter, the sequence of addresses including the first address; incrementing the counter based at least in part on accessing the first location, the counter having a second value based at least in part on the incrementing a first time; accessing a second location of the memory array at a second address corresponding to the second value of the counter; and incrementing the counter based at least in part on accessing the second location, the counter having a third value based at least in part on the incrementing the counter a second time.

Aspect 15: The apparatus of aspect 14 where accessing the set of addresses as part of the procedure, further includes operations, features, circuitry, logic, means, or instructions, or any combination thereof for accessing, based at least in part on pausing the second procedure after accessing the second location of the memory array, a third location of the memory array at an address of the set of addresses, the address of the set of addresses being different than a third address of the memory array corresponding to the third value of the counter.

Figure 8:
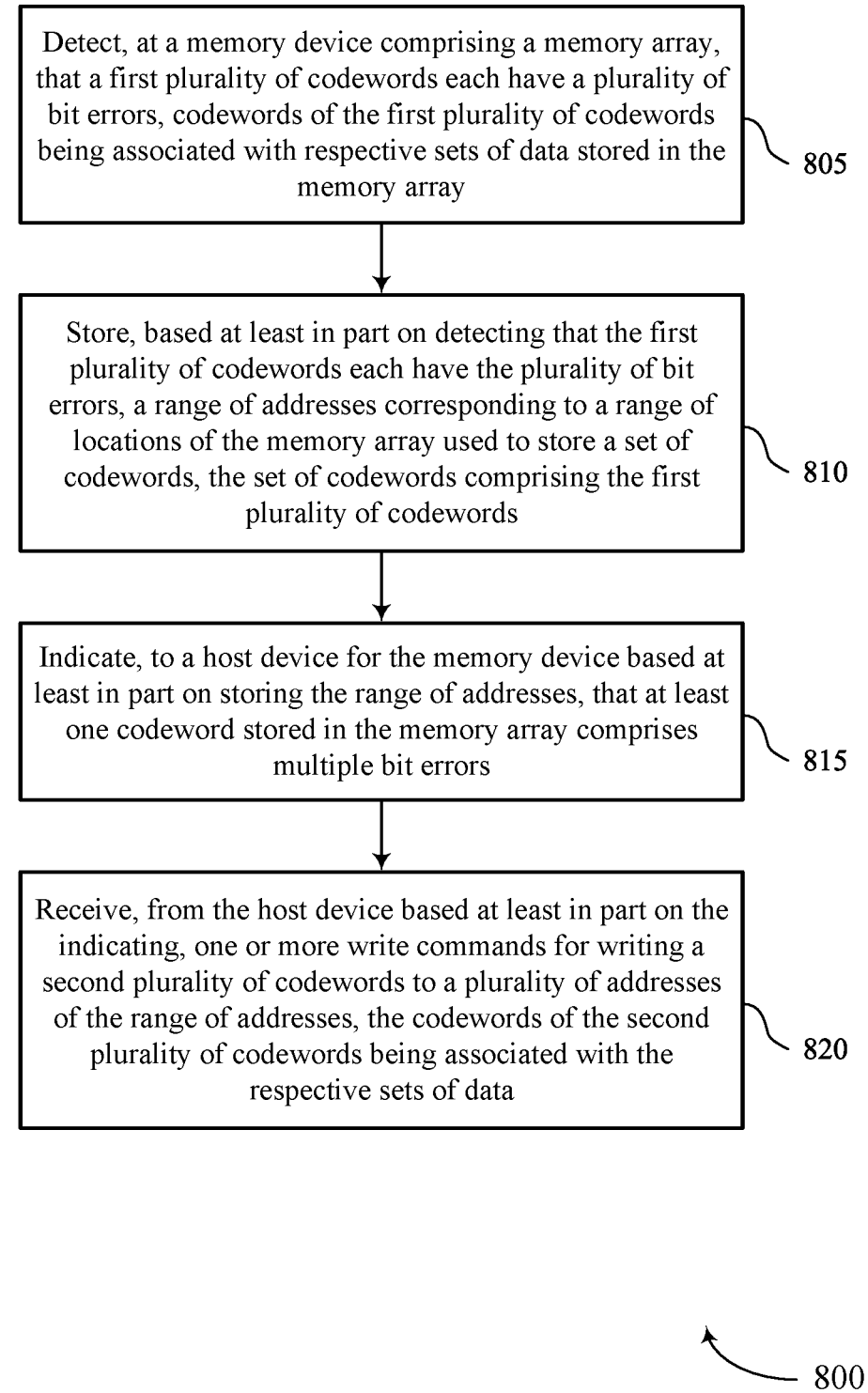

FIG. 8 shows a flowchart illustrating a method 800 that supports memory array error correction in accordance with examples as disclosed herein. The operations of method 800 may be implemented by a memory device or its components as described herein. For example, the operations of method 800 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 805, the method may include detecting, at a memory device including a memory array, that a first plurality of codewords each have a plurality of bit errors, codewords of the first plurality of codewords being associated with respective sets of data stored in the memory array. The operations of 805 may be performed in accordance with examples as disclosed herein. In some examples, aspects of the operations of 805 may be performed by a data protection component 525 as described with reference to FIG. 5.

At 810, the method may include storing, based at least in part on detecting that the first plurality of codewords each have the plurality of bit errors, a range of addresses corresponding to a range of locations of the memory array used to store a set of codewords, the set of codewords including the first plurality of codewords. The operations of 810 may be performed in accordance with examples as disclosed herein. In some examples, aspects of the operations of 810 may be performed by an error management component 530 as described with reference to FIG. 5.

At 815, the method may include indicating, to a host device for the memory device based at least in part on storing the range of addresses, that at least one codeword stored in the memory array includes multiple bit errors. The operations of 815 may be performed in accordance with examples as disclosed herein. In some examples, aspects of the operations of 815 may be performed by an error indication component 535 as described with reference to FIG. 5.

At 820, the method may include receiving, from the host device based at least in part on the indicating, one or more write commands for writing a second plurality of codewords to a plurality of addresses of the range of addresses, the codewords of the second plurality of codewords being associated with the respective sets of data. The operations of 820 may be performed in accordance with examples as disclosed herein. In some examples, aspects of the operations of 820 may be performed by a command component 540 as described with reference to FIG. 5.

In some examples, an apparatus as described herein may perform a method or methods, such as the method 800. The apparatus may include, features, circuitry, logic, means, or instructions (e.g., a non-transitory computer-readable medium storing instructions executable by a processor), or any combination thereof for performing the following aspects of the present disclosure:

Aspect 16: The apparatus, including features, circuitry, logic, means, or instructions, or any combination thereof for detecting, at a memory device including a memory array, that a first plurality of codewords each have a plurality of bit errors, codewords of the first plurality of codewords being associated with respective sets of data stored in the memory array; storing, based at least in part on detecting that the first plurality of codewords each have the plurality of bit errors, a range of addresses corresponding to a range of locations of the memory array used to store a set of codewords, the set of codewords including the first plurality of codewords; indicating, to a host device based at least in part on storing the range of addresses, that at least one codeword stored in the memory array includes multiple bit errors; and receiving, from the host device based at least in part on the indicating, one or more write commands for writing a second plurality of codewords to a plurality of addresses of the range of addresses, the codewords of the second plurality of codewords being associated with the respective sets of data.

Aspect 17: The apparatus of aspect 16 where storing the range of addresses, further includes operations, features, circuitry, logic, means, or instructions, or any combination thereof for storing, in a register, a first address of the memory array and a second address of the memory array based at least in part on detecting that the first plurality of codewords each have a plurality of errors, the range of addresses including addresses between the first address of the memory array and the second address of the memory array.

Aspect 18: The apparatus of any of aspects 16 through 17, further including operations, features, circuitry, logic, means, or instructions, or any combination thereof for detecting, at the memory device, that a third plurality of codewords each have a second plurality of bit errors, codewords of the third plurality of codewords being associated with respective second sets of data stored in the memory array and storing, based at least in part on detecting that the third plurality of codewords each have the second plurality of bit errors, a second range of addresses corresponding to a second range of locations of the memory array used to store a second set of codewords, the second set of codewords including the second plurality of codewords.

Aspect 19: The apparatus of aspect 18, further including operations, features, circuitry, logic, means, or instructions, or any combination thereof for receiving, from the host device based at least in part on the indicating, one or more second write commands for writing a fourth plurality of codewords to a second plurality of addresses of the second range of addresses, the codewords of the fourth plurality of codewords being associated with the respective second sets of data.

Aspect 20: The apparatus of any of aspects 16 through 19 where indicating that the at least one codeword stored in the memory array includes multiple bit errors, further includes operations, features, circuitry, logic, means, or instructions, or any combination thereof for applying a voltage to a pin that is coupled with a bus that connects the host device to the memory array, where the pin is configured to be idle during read operations.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
  detecting, at a memory device comprising a memory array, that a codeword has a plurality of bit errors, the codeword being associated with a set of data stored in the memory array;
  storing, based at least in part on detecting that the codeword has the plurality of bit errors, an address of a location of the memory array used to store the codeword;
  indicating, to a host device based at least in part on storing the address, that one or more codewords stored in the memory array each comprise multiple bit errors, the one or more codewords comprising the codeword; and
  receiving, from the host device based at least in part on the indicating, a write command for writing a second codeword to the address of the memory array, the second codeword being associated with the set of data.

2. The method of claim 1, further comprising:
  receiving a read command comprising the address;
  retrieving the codeword from the location in the memory array based at least in part on the address of the read command; and
  performing a data protection operation on the codeword based at least in part on retrieving the codeword, wherein detecting that the codeword has the plurality of bit errors is based at least in part on the data protection operation.

3. The method of claim 1, further comprising:
  receiving, from the host device based at least in part on the indicating, a read command comprising the address; and
  transmitting, based at least in part on receiving the read command, the codeword to the host device.

4. The method of claim 1, wherein storing the address comprises:
  writing the address to a register of the memory device.

5. The method of claim 4, further comprising:
  receiving, from the host device based at least in part on the indicating, a request to read the register; and
  transmitting, to the host device, the address based at least in part on receiving the request, wherein receiving the write command is based at least in part on transmitting the address.

6. The method of claim 4, further comprising:
  detecting that a third codeword has a second plurality of bit errors, the third codeword being associated with a second set of data stored in the memory array;
  writing, to the register and based at least in part on detecting that the third codeword has the second plurality of bit errors, a second address of a second location of the memory array used to store the third codeword;
  receiving, from the host device based at least in part on the indicating, a request to read the register; and
  transmitting, to the host device, the address and the second address based at least in part on receiving the request, wherein receiving the write command is based at least in part on transmitting the address and the second address.

7. The method of claim 1, wherein indicating that the one or more codewords stored in the memory array respectively comprise multiple bit errors comprises:
  applying a voltage to a pin that is coupled with a bus that connects the host device to the memory array, wherein the pin is configured to be idle during read operations.

8. The method of claim 7, wherein the pin is a data mask pin of the memory device.

9. A method, comprising:
  receiving, at a memory device comprising a memory array, a command from a host device, the command comprising a plurality of addresses of the memory array and a trigger for a procedure for correcting errors in codewords stored at the plurality of addresses;
  initiating, by the memory device, the procedure based at least in part on the command;
  accessing, as part of the procedure, a plurality of locations of the memory array in accordance with a sequence of addresses of the plurality of addresses based at least in part on receiving the command comprising the plurality of addresses; and
  correcting, as part of the procedure, codewords at one or more of the plurality of locations of the memory array based at least in part on the accessing.

10. The method of claim 9, further comprising:
  initiating a second procedure associated with correcting errors in codewords stored at the memory array; and
  accessing, as part of the second procedure, a plurality of second locations of the memory array at a second plurality of addresses of the memory array in accordance with a second sequence of addresses of the memory array.

11. The method of claim 10, wherein accessing the plurality of second locations in accordance with the second sequence of addresses comprises:
  accessing the plurality of second locations of the memory array corresponding to the second plurality of addresses of the second sequence of addresses based at least in part on a value of a counter associated with the second procedure, wherein values of the counter correspond to respective addresses of the second sequence of addresses, and wherein the counter is incremented each time a location of the plurality of second locations is accessed as part of the second procedure.

12. The method of claim 10, wherein the second procedure is initiated prior to receiving the command from the host device, the method further comprising:
  pausing the second procedure based at least in part on receiving the command, wherein the plurality of locations of the memory array at the plurality of addresses are accessed as part of the procedure based at least in part on pausing the second procedure.

13. The method of claim 12, further comprising:
  resuming the second procedure based at least in part on completing the procedure; and
  accessing, based at least in part on resuming the second procedure, a plurality of third locations of the memory array at the second plurality of addresses of the second sequence of addresses of the memory array.

14. The method of claim 12, further comprising:
  determining, based at least in part on initiating the second procedure, a first value of a counter associated with the second procedure, wherein accessing the second sequence of addresses as part of the second procedure comprises:
    accessing a first location of the memory array at a first address corresponding to the first value of the counter, the second sequence of addresses comprising the first address;

incrementing the counter based at least in part on accessing the first location, the counter having a second value based at least in part on the incrementing a first time;

accessing a second location of the memory array at a second address corresponding to the second value of the counter; and incrementing the counter based at least in part on accessing the second location, the counter having a third value based at least in part on the incrementing the counter a second time.

15. The method of claim 14, wherein accessing the plurality of addresses as part of the procedure comprises:

accessing, based at least in part on pausing the second procedure after accessing the second location of the memory array, a third location of the memory array at an address of the plurality of addresses, the address of the plurality of addresses being different than a third address of the memory array corresponding to the third value of the counter.

16. A method, comprising:

detecting, at a memory device comprising a memory array, that a first plurality of codewords each have a plurality of bit errors, codewords of the first plurality of codewords being associated with respective sets of data stored in the memory array;

storing, based at least in part on detecting that the first plurality of codewords each have the plurality of bit errors, a range of addresses corresponding to a range of locations of the memory array used to store a set of codewords, the set of codewords comprising the first plurality of codewords;

indicating, to a host device based at least in part on storing the range of addresses, that at least one codeword stored in the memory array comprises multiple bit errors; and receiving, from the host device based at least in part on the indicating, one or more write commands for writing a second plurality of codewords to a plurality of addresses of the range of addresses, the codewords of the second plurality of codewords being associated with the respective sets of data.

17. The method of claim 16, wherein storing the range of addresses comprises:

storing, in a register, a first address of the memory array and a second address of the memory array based at least in part on detecting that the first plurality of codewords each have a plurality of errors, the range of addresses comprising addresses between the first address of the memory array and the second address of the memory array.

18. The method of claim 16, further comprising:

detecting, at the memory device, that a third plurality of codewords each have a second plurality of bit errors, codewords of the third plurality of codewords being associated with respective second sets of data stored in the memory array; and storing, based at least in part on detecting that the third plurality of codewords each have the second plurality of bit errors, a second range of addresses corresponding to a second range of locations of the memory array used to store a second set of codewords, the second set of codewords comprising the second plurality of codewords.

19. The method of claim 18, further comprising:

receiving, from the host device based at least in part on the indicating, one or more second write commands for writing a fourth plurality of codewords to a second plurality of addresses of the second range of addresses, the codewords of the fourth plurality of codewords being associated with the respective second sets of data.

20. The method of claim 16, wherein indicating that the at least one codeword stored in the memory array comprises multiple bit errors comprises:

applying a voltage to a pin that is coupled with a bus that connects the host device to the memory array, wherein the pin is configured to be idle during read operations.

* * * * *